(12) United States Patent
Kong et al.

(10) Patent No.: US 9,076,533 B2
(45) Date of Patent: Jul. 7, 2015

(54) METHOD OF REPROGRAMMING NONVOLATILE MEMORY COMPRISING MARKING SOME CELLS AS BLANKS

(71) Applicant: Samsung Electronics Co., Ltd., Suwon-Si, Gyeonggi-Do (KR)

(72) Inventors: Jun-Jin Kong, Yongin-Si (KR); Avner Dor, Kfar Saba (IL); Moshe Twitto, Ramat Gan (IL); Shay Landis, Ramat Gan (IL)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 13/803,390

(22) Filed: Mar. 14, 2013

(65) Prior Publication Data

US 2013/0322175 A1 Dec. 5, 2013

(30) Foreign Application Priority Data

May 30, 2012 (KR) ........................ 10-2012-0057514

(51) Int. Cl.
*G11C 16/10* (2006.01)
*G11C 11/56* (2006.01)
*G11C 16/04* (2006.01)
*G11C 16/34* (2006.01)

(52) U.S. Cl.
CPC ............ *G11C 16/10* (2013.01); *G11C 16/0483* (2013.01); *G11C 16/349* (2013.01); *G11C 11/5628* (2013.01)

(58) Field of Classification Search
CPC .... G11C 11/34; G11C 16/04; G11C 16/0483; G11C 16/349
USPC ............. 365/185.11, 185.22, 185.02, 185.19, 365/185.18, 185.03
See application file for complete search history.

(56) References Cited

U.S. PATENT DOCUMENTS

| 7,804,718 | B2 | 9/2010 | Kim | |
|---|---|---|---|---|
| 2002/0048202 | A1* | 4/2002 | Higuchi | 365/200 |
| 2004/0179399 | A1* | 9/2004 | Miwa et al. | 365/185.03 |
| 2006/0062049 | A1* | 3/2006 | Lee et al. | 365/185.22 |
| 2008/0253191 | A1* | 10/2008 | Kang | 365/185.18 |
| 2011/0063918 | A1* | 3/2011 | Pei et al. | 365/185.18 |
| 2011/0103151 | A1* | 5/2011 | Kim et al. | 365/185.19 |
| 2013/0088916 | A1* | 4/2013 | Sarpatwari et al. | 365/185.02 |

FOREIGN PATENT DOCUMENTS

| JP | 06349286 | 12/1994 |
|---|---|---|
| JP | 08221994 | 8/1998 |
| JP | 2001229073 | 8/2001 |
| JP | 2004220644 | 8/2004 |
| JP | 2004310268 | 11/2004 |
| JP | 2005-216455 | 8/2005 |
| KR | 2010046757 A | 5/2010 |

* cited by examiner

*Primary Examiner* — Alexander Sofocleous
*Assistant Examiner* — Muhammad Islam
(74) *Attorney, Agent, or Firm* — Volentine & Whitt, PLLC

(57) ABSTRACT

A method of operating a memory device includes programming a first data signal to a first memory cell, attempting to program a second data signal to the first memory cell in a state where the first memory cell is not erased, and marking the first memory cell as blank upon failing to program the second data signal to the first memory cell.

9 Claims, 7 Drawing Sheets

METHOD OF REPROGRAMMING NONVOLATILE MEMORY COMPRISING MARKING SOME CELLS AS BLANKS

CROSS-REFERENCE TO RELATED APPLICATIONS

This application claims priority under 35 U.S.C. §119 to Korean Patent Application No. 10-2012-0057514 filed May 30, 2012, the subject matter of which is hereby incorporated by reference.

BACKGROUND OF THE INVENTION

The inventive concept relates generally to electronic memory technologies. More particularly, certain embodiments of the inventive concept relate to techniques and technologies for reprogramming NAND flash memory cells by marking some cells as blanks.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include read-only memory (ROM), electrically erasable programmable read-only memory (EEPROMs), and flash memories.

Although nonvolatile memories can retain stored data when disconnected from power, there are limits to their retention capability as well as their lifetime in general. One limit on the lifetime of nonvolatile memories is limited program/erase (P/E) endurance. P/E endurance refers to the number of program and/or erase operations that a nonvolatile memory cell can withstand before it fails or becomes unreliable. For example, memory cells in a NAND flash memory device may have a P/E endurance of a hundred thousand program and/or erase operations or less. In general, the P/E endurance of a memory cell tends to decrease in proportion to decreasing dimensions and geometry. For example, while a single-bit cell in a NAND flash memory may have a P/E endurance of 100,000, a multi-level cell in a NAND flash memory may have a P/E endurance of only 10,000.

In a NAND flash memory, block erase operations tend to have a comparatively greater impact than other operations on the lifetime of a memory cell. In a typical block erase operation, for example, a very high negative voltage is applied to a bulk, and a control gate is maintained at a voltage of zero. This creates a relatively high potential difference that removes electric charge stored in a floating gate. The use of these relatively high voltages, however, adds significant wear to the erased memory cells.

In view of the limited P/E endurance of NAND flash memory devices and other forms of nonvolatile memory, there is a general need for techniques and technologies that can prolong their lifetime, especially in view of the continuing trend to decrease device dimensions.

SUMMARY OF THE INVENTION

In one embodiment of the inventive concept, a method of operating a nonvolatile memory device comprises performing a first program operation to program a first data signal in a first memory cell, wherein the first data signal is programmed as a first program state having a first threshold voltage range, determining whether a second data signal corresponds to a program state having a threshold voltage range lower than the first threshold voltage range, and upon determining that the second data signal corresponds to a program state having a threshold voltage range lower than the first threshold voltage range, performing a second program operation to program a blanking signal in the first memory cell, wherein the blanking signal is programmed as a blank state having a second threshold voltage range greater than the first threshold voltage range.

In another embodiment of the inventive concept, a method reprogramming a NAND flash memory device prior to erase by marking some cells as blanks comprises programming a data signal to a plurality of memory cells of a memory device, attempting to program a additional data signal to the memory cells in a state where the memory cells are not programmed, and providing addresses of some memory cells, to which the additional data signal fails to be programmed, among the memory cells.

In another embodiment of the inventive concept, a method of operating a memory device comprises programming a first data signal to a first memory cell, attempting to program a second data signal to the first memory cell in a state where the first memory cell is not erased, and marking the first memory cell as blank upon failing to program the second data signal to the first memory cell.

These and other embodiments of the inventive concept can potentially improve the lifetime and performance of a memory device by allowing memory cells to be reprogrammed without first performing a block erase operation.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the terms first, second, etc. may be used herein to describe various elements, components, regions, layers and/or sections. However, the described elements, components, regions, layers and/or sections should not be limited by these terms. Rather, these terms are only used to distinguish one element, component, region, layer or section from another element, component, region, layer or section. Thus, a first element, component, region, layer or section discussed below could be termed a second element, component, region, layer or section without departing from the relevant teachings.

The terminology used herein is for the purpose of describing particular embodiments only and is not intended to be limiting of the inventive concept. As used herein, the singular forms "a," "an" and "the" are intended to encompass the plural forms as well, unless the context clearly indicates otherwise. It will be further understood that terms such as "comprises," "comprising," "includes" and/or "comprising," when used in this specification, indicate the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

A flash memory device will hereinafter be described as an example of a nonvolatile memory device. However, the nonvolatile memory device is not limited to the flash memory device.

Figure 1:
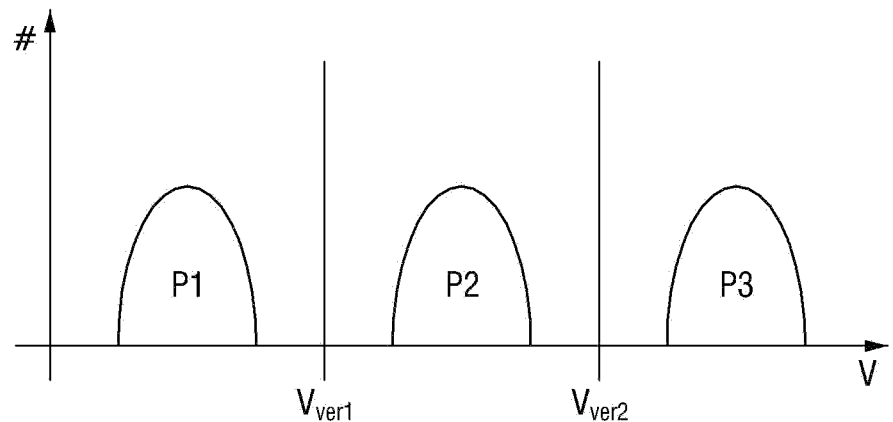
FIGS. 1 through 3 are diagrams illustrating a method of programming a nonvolatile memory device according to an embodiment of the inventive concept.
Figure 2:
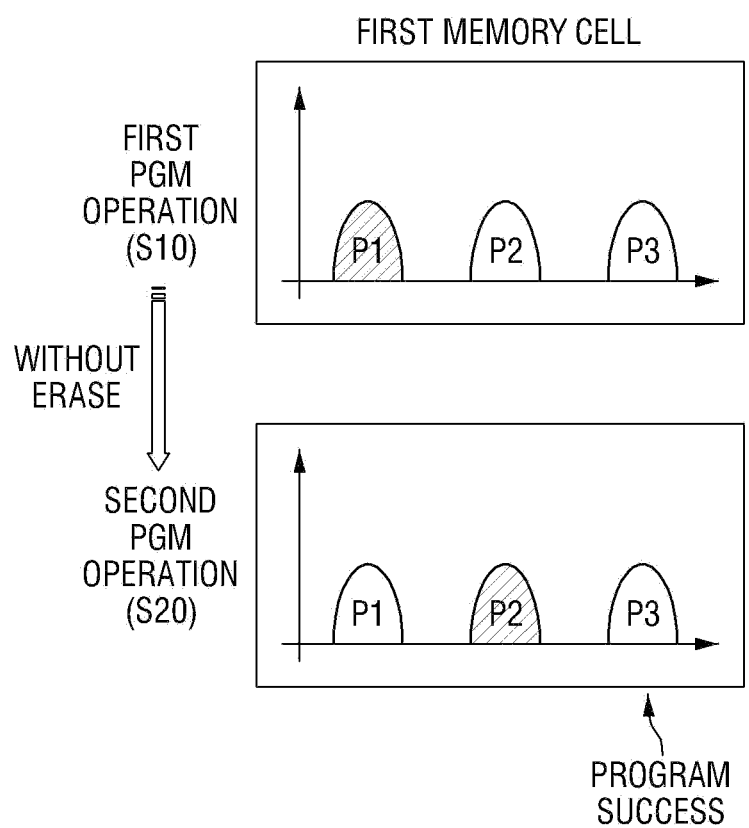
Figure 3:
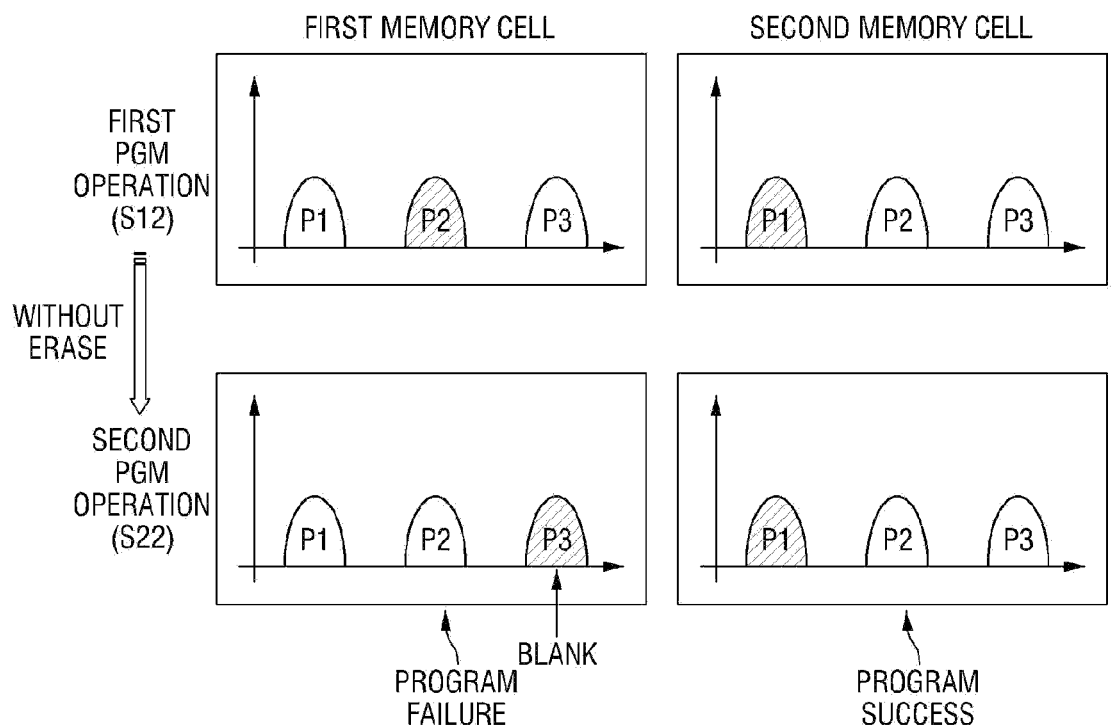

FIGS. 1 through 3 are diagrams illustrating a method of programming a nonvolatile memory device according to an embodiment of the inventive concept. More particularly, FIG. 1 is a threshold voltage diagram illustrating three different program states to which memory cells may be programmed according to an embodiment of the inventive concept, FIG. 2 is a threshold voltage diagram illustrating the programming of a first memory cell using the program states of FIG. 1, and FIG. 3 is a threshold voltage diagram illustrating the programming of first and second memory cells using the program states of FIG. 1.

In each of FIGS. 1 through 3, an x-axis represents a threshold voltage required to turn on a selected memory cell, and a y-axis represents the number of memory cells having each threshold voltage according to different program states. In other words, FIGS. 1 through 3 show threshold voltage distributions for the different program states.

Referring to FIG. 1, three threshold voltage distributions are illustrated as an example. The three voltage distributions comprise first through third threshold voltage distributions P1 through P3, where first threshold voltage distribution P1 corresponds to an erased state, second threshold voltage distribution P2 corresponds to a programmed state, and third threshold voltage distribution P3 corresponds to a blank state.

Two verification voltages Vver1 and Vver2 are used to distinguish between the three threshold voltage distributions P1 through P3 in a read operation. The levels of verification voltages Vver1 and Vver2 shown in FIG. 1 are merely an example, and the inventive concept is not limited to this example.

First and second threshold voltage distributions P1 and P2 are regions corresponding to data signals, or input data, and third threshold voltage distribution P3 is a region corresponding to a blanking signal.

FIG. 1 shows only three threshold voltage distributions for the sake of simplicity, but the number of threshold voltage distributions can be expanded to (K+1) threshold voltage distributions, where first through $K^{th}$ threshold voltage distributions are regions corresponding to data signals, and a $(K+1)^{th}$ threshold voltage distribution, which is a uppermost threshold voltage distribution among the (K+1) threshold voltage distributions, is a region corresponding to a blanking signal.

In the method of FIGS. 1 through 3, multiple program operations are performed on a selected memory cell without an intervening erase operation. If one of the program operations fails, the selected memory cell is programmed to the blank state. An example of a successful program operation is shown in FIG. 2, and an example of a failed program operation and subsequent blanking of a selected memory cell is shown in FIG. 3.

In the example of FIGS. 2 and 3, it is assumed that a first data signal corresponds to data stored in the selected memory cell during a first program operation and that a second data signal corresponds to data stored in the selected memory cell during a second program operation. In addition, it is assumed that the first program operation is performed after an erase operation without an intervening program operation, and that the second program operation follows the first program operation without an intervening erase operation. In general, any number of second program operations may be performed after the first program operation without an intervening erase operation.

Referring to FIG. 2, in a first program operation (S10), the method programs a first data signal x to a first memory cell. First data signal x corresponds to first threshold voltage distribution P1, which may represent a data value of zero, for instance. Thereafter, in a second program operation (S20), the method attempts to program a second data signal y to the first memory cell. Second data signal y corresponds to second threshold voltage distribution P2, which may represent a data value of one, for instance.

Before programming second data signal y in the first memory cell, the method compares first data signal x, which is pre-stored in the first memory cell, to second data signal y. In this comparison, second data signal y is considered to be greater than or equal to first data signal x if the threshold voltage distribution corresponding to second data signal y is located at the same voltage range or a higher voltage range than a threshold voltage distribution corresponding to first data signal x. Where second data signal y is greater than or equal to first data signal x, second data signal y is programmed to the first memory cell. That is, in the second program operation (S20), second data signal y is stored in the first memory cell. The storage of this information is deemed to be a "program success."

Where second data signal y is greater than the data signal x, the difference between the data signal x and second data signal y is additionally programmed to the first memory cell, thereby programming second data signal y to the first memory cell. For instance, in the example of FIG. 2, a difference between second program state P2 and first program state P1 is programmed in the first memory cell. As indicated above, the first memory cell may be a flash memory cell, for example. Accordingly, the above difference can be programmed in the first memory cell by adjusting the amount of charge stored in a floating gate by adjusting voltage levels of a gate, source, drain, and bulk of the flash memory cell. In other words, a desired amount of charge can be injected into a charge storage layer (or a charge trapping layer) of a flash memory.

Where first data signal x is equal to second data signal y, a second program operation is unnecessary.

Referring to FIG. 3, in a first program operation (S12), the method programs a first data signal x to each of a first memory cell and a second memory cell. The first data signal x stored in the first memory cell corresponds to second threshold voltage distribution P2, and the first data signal x stored in the second memory cell corresponds to first threshold voltage distribution P1.

In a second program operation (S22), the method attempts to program a second data signal y to the first memory cell without an intervening erase operation. For explanation purposes, it will be assumed that the second data signal y for both the first and second memory cells corresponds to the first threshold voltage distribution P1.

The data signal x and second data signal y of the first memory cell are compared. Because the second data signal y is smaller than the first data signal x, the second data signal y cannot be programmed in the first memory cell. Accordingly, the method determines that a "program failure" has occurred. As a consequence of the program failure, the first memory cell is programmed to the blank state, i.e., third threshold voltage distribution P3. Stated another way, a predetermined blanking signal is programmed to the first memory cell. The predetermined blanking signal corresponds to an uppermost threshold voltage distribution P3 among threshold voltage distributions P1 through P3. However, the inventive concept is not limited thereto.

Subsequently, in a read operation, the first memory cell in the blank state is skipped. In other words, where the blanking signal is read during a read operation, the read blanking signal is processed as nonexistent data.

Where second data signal y fails to be programmed in the first memory cell, the method attempts to program second data signal y in the second memory cell. Specifically, the data signal x stored in the second memory cell is compared with the second data signal y of the first memory cell. Because the data signal x stored in the second memory cell is the same as second data signal y in the second program operation (S22) can store second data signal y in the second memory cell.

Certain aspects of the above-described program operation and blanking operation, as implemented in some embodiments, can be generalized as follows.

First, it is assumed that Ncell is the total number of memory cells and that $2 \leq K(1) \leq K$, $2 \leq K(2) \leq K$ and $K'(2)=K-K(2)+1$. In addition, it is assumed that $K'(2) \leq K(1)$. $K(1)$ is an alphabet size in a first program operation, $K(2)$ is an alphabet size in a second program operation. In the first program operation, a data signal $x_n$ is programmed to an $n^{th}$ memory cell. Here, it is assumed that $x_n$ is selected from $S_1 = \{d_1, \ldots, d_{K(1)}\}$ and has a uniform distribution in $S_1$. $d_1, \ldots, d_{K(1)}$ are program states $(d_1 < \ldots < d_{K(1)})$.

A additional data signal $\{y_m\}_{1 \leq m \leq M}$ ($y_m \in S_2$, where $S_2 = \{d_{K'(2)}, \ldots d_K\}$) is stored in a second program operation. Here, $y_m$ has a uniform distribution in $S_2$, and $\{x_n\}_{1 \leq n \leq Ncell} \cup \{y_m\}_{1 \leq m \leq M}$ is pair-wise independent.

Thereafter, the second program operation begins. In a state where $x_1$ is stored in a first memory cell, if $y_1 \geq x_1$, a threshold voltage difference, represented symbolically as "$y_1 - x_1$", is additionally programmed to the first memory cell, thereby programming $y_i$. Then, an index of the first memory cell is set to "$c(1)=1$."

On the other hand, if $y_1 < x_1$, the above process is performed on a next memory cell after the first memory cell is blanked. The above process is repeated until a memory cell that satisfies $y_1 \geq x_{c(1)}$, that is, a memory cell that can be called "$c(1)$" is found.

Here, assuming that $n \geq 2$, that $1 \leq c(1) < c(2) < \ldots < c(n-1)$, and that $i = 1, \ldots, n-1$, $y_i \geq x_{c(i)}$, and $c(i-1) < j < c(i)$. For $c(0)=0$, $y_i < x_j$, and a blanking signal $d_{K+1}$ is programmed into a $j^{th}$ memory cell during the second program operation. In addition, $y_i$ is stored in a $c(i)$ memory cell.

The above process is further illuminated by the following Table 1.

TABLE 1

|  | First memory cell | Second memory cell | Third memory cell | Fourth memory cell |
| --- | --- | --- | --- | --- |
| Data signal | $x_1$ | $x_2$ | $x_3$ | $x_4$ |
| Index | C(1) memory cell (c(1) = 1) | C(2) memory cell (c(2) = 2) |  | C(3) memory cell (c(3) = 4) |
| Additional data signal | $y_1$ | $y_2$ | Blanking signal | $y_3$ |

As indicated by Table 1, where a additional data signal $y_n$ is stored, if $x_{c(n-1)+1} \leq y_n$, $y_n - x_{c(n)}$ is added to a c(n) memory cell, thereby programming $y_n$. Then, an index of the c(n) memory cell is set to $c(n)=c(n-1)+1$.

Where $x_{c(n-1)+1} > y_n$, the above process is performed on a next memory cell after the c(n) memory cell is blanked. That is, where a memory cell that can be called "c(n)" is found, $y_n - x_{c(n)}$ is added to the memory cell in a similar way as described above, thereby programming $y_n$.

The amount of data that can be stored when the above program operation and blanking operation are performed will now be described.

A data signal stored in each memory cell is a uniformly distributed random variable for S. In addition, it is assumed that each memory cell follows a (pseudo) random independent permutation of the K-alphabet. That is, it is assumed that a permutation $\pi_c$: $S \rightarrow S$ is sampled randomly for each memory cell c, independently of other memory cells. For $S_K$, $\pi_c$ is sampled with a uniform distribution. As in the following Equation (1), a shift permutation may be used. For $a \in \{0, \ldots, K-1\}$, $\sigma_a: S \rightarrow S$ is defined by the following Equation (1).

$$\sigma_a(d_k) = d_{mod^*(a+k,K)} \text{ (for } k \in \{1, \ldots, K\}) \tag{1}$$

For example, where $K=4$, $k \in \{1,2,3,4\}$ and $a=2$, $\sigma_a(d_1) = d_{mod^*(2+1,4)} = d_3$, and $\sigma_a(d_2) = d_{mod^*(2+2,4)} = d_4$. Here, mod* indicates a modulo output of $\{1, \ldots, K\}$. In addition, a $\sigma_a$-permutation may be less complicated, and $a=a(c)$ ($c=$ an index of a memory cell) may be a pseudo random. Accordingly, second data signal y may be converted into $\sigma_{a(c)}(y)$.

Based on this assumption, a probability p that a memory cell will store a additional data signal in the second program operation may be calculated by the following Equation (2).

$$p = (1 + 1/K)/2 \tag{2}$$

Equation (2) may be derived as follows. It is assumed that a data signal $x \in \{1, \ldots, K\}$ is stored in some memory cells and that a additional data signal which should be stored in the second program operation is $y \in \{1, \ldots, K\}$. Here, x and y are statistically independent from each other. In addition, x and y are sampled from a uniform distribution of $\{1, \ldots K\}$. Because the second program operation is performed where $y \geq x$, p is a probability that $y \geq x$. Therefore, the probability p is calculated by the following Equation (3).

$$p = |\{(x,y): x,y \in \{1, \ldots, K\}, x \leq y\}|/K^2 = (K(K+1)/2)/K^2 = (1+1/K)/2 \tag{3}$$

An expected number of memory cells that can store the additional data signal in the second program operation is n×p, where n is the total number of memory cells that participate in a program operation. Consequently, an expected number of raw bits that are programmed during two program operations is as indicated in the following Equation (4). Here, a raw bit encompasses both a data signal and an error correction code (ECC) bit.

$$C = n \cdot (p+1) \cdot \log_2(K) \quad (4)$$

Equation (4) may be derived as follows. In the first program operation, each memory cell may have K symbols. Accordingly, $K^n$ symbols may exist in a block of n memory cells. If n is very large, $2^{C'} = K^n$. Therefore, $C' = \log_2(K^n) = n\log_2(K)$ bits.

In the second program operation, each memory cell may store any one of the K symbols from $\{1, \ldots, K\}$ with a uniform probability. If n is sufficiently large, n×p memory cells may achieve "program success," where p is the probability of program success in the second program operation. Therefore, $K^{n \times p}$ symbols may be stored in the block of n memory cells during the second program operation. Thus, roughly, $C'' = \log_2(K^{n \times p}) = n \times p \times \log_2(K)$ bits.

Consequently, an expected number of bits in the first and second program operations may be $C = C' + C'' = n(p+1)\log_2(K)$.

A memory controller may control a portion of memory cells which corresponds to a constant q ($0 < q \leq \frac{1}{2}$) to be within the second program operation at a certain time after several initial stages. In this case, an average of R bits may be stored in a memory cell at the certain time, where R is defined by the following Equation (5).

$$R = \log_2(K) \cdot (1 - q + q \cdot p) = \log_2(K) \cdot (1 - (1-p) \cdot q) \quad (5)$$

In addition, an average number of bits stored between two erase operations may be C.

$$C = \log_2(K) \cdot ((1+p) \cdot 2q + 1 - 2q) = \log_2(K) \cdot (1 + 2q \cdot p) \quad (6)$$

Equations (5) and (6) may be derived as follows.

First, it may be assumed that q=½. In an even-numbered program operation, odd-numbered memory cells may be in the first program operation, and even-numbered memory cells may be in the second program operation. In an odd-numbered program operation, the odd-numbered memory cells may be in the second program operation, and the even-numbered memory cells may be in the first program operation. This scheme may be referred to as an "even-odd scheme." In this case, because q=½, $\log_2(K) \cdot (1-q+q \cdot p) = (\frac{1}{2}) \cdot \log_2(K) \cdot (1+p) = R$, and $C = \log_2(K) \cdot (1+p)$.

To verify a more general case, it may be assumed that q=½−δ (where 0<δ<½) and that N is the number of memory cells of a NAND flash memory device. It may also be assumed that 2δ·N memory cells perform a program operation without the above-described blanking operation (perform a general program operation, that is, surely perform an erase operation before a program operation), whereas the remaining (1−2δ)·N(=2q·N) memory cells perform the blanking operation.

In addition, half (i.e., q·N) of memory cells that perform the blanking operation may be in the first program operation, and the other half (i.e., q·N) of the memory cells that perform the blanking operation may be in the second program operation.

If the above-described even-odd scheme is applied to this case, in each program operation, q·N memory cells are in the second program operation, and (1−q)·N memory cells are in the first program operation. Therefore, an average number of bits stored in a memory cell at a certain time is in the following Equation (7).

$$R = \log_2(K) \cdot (1-q) + \log_2(K) \cdot q \cdot p \quad (7)$$

That is, R is verified.

In addition, C', $C_1$, and $C_2$ may be assumed as in the following Equations (8)-(10).

$$C = \log_2(K) \cdot ((1+p) \cdot 2q + 1 - 2q) = \log_2(K) \cdot ((1+p) \cdot (1-2\delta) + 2\delta) \quad (8)$$

$$C_1 = N \cdot \log_2(K) \cdot (1+p) \cdot (1-2\delta) \quad (9)$$

$$C_2 = \log_2(K) \cdot 2\delta \quad (10)$$

From Equation (4) above, an expected number of bits stored in memory cells that participate in a blanking scheme between two erase operations may be $C_1$. In addition, an expected number of bits stored in memory cells that are erased after each program operation between two erase operations may be $C_2$. Therefore, $C_1 + C_2 = C' = C$.

Figure 4:
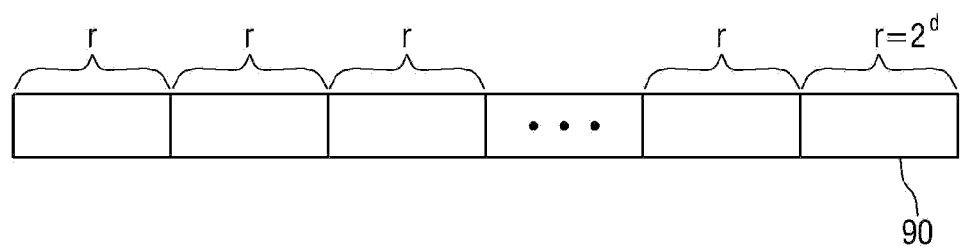
FIG. 4 is a diagram illustrating a method of programming a nonvolatile memory device according to an embodiment of the inventive concept.

FIG. 4 is a diagram illustrating a method of programming a nonvolatile memory device according to another embodiment of the inventive concept. In contrast to the method described above with reference to FIGS. 1 through 3, the method of FIG. 4 does not use a blanking operation. For example, where a probability w of program failure in a second program operation is very low, the uppermost threshold voltage distribution of FIGS. 1-3 will not be used. Instead, supplemental data may be generated to indicate positions of memory cells (hereinafter, referred to as "unused memory cells") that fail to be programmed in the second program operation. The size of the additional information may be bounded by the following Equation (11), which can be derived from information theory.

$$n \cdot h_2(w) = -n \cdot (w \cdot \log_2(w) + (1-w) \cdot \log_2(1-w)) \quad (11)$$

In Equation (11), n is the number of programmed memory cells. The unused memory cells should be reported appropriately. The reporting method may be as follows.

Referring to FIG. 4, a plurality of memory cells are divided into sub-blocks 90, each having a size of $r=2^d$. Here, d is a natural number, and $2^d \geq 1/w \geq 2^{d-1}$.

Positions of unused memory cells in each sub-block 90 are associated with short addresses. In other words, the positions of the unused memory cells can be indicated by short addresses in a sub-block that includes the unused memory cells. A short address may be d bits. A list of such short addresses is expected to be $d \cdot n \cdot w \approx n \cdot w \cdot \log(1/w)$ bits in length. This may be programmed as a continuous bit stream.

In addition to providing short addresses of unused memory cells, the number of unused memory cells in each sub-block may be included in a header and provided accordingly.

Figure 5:
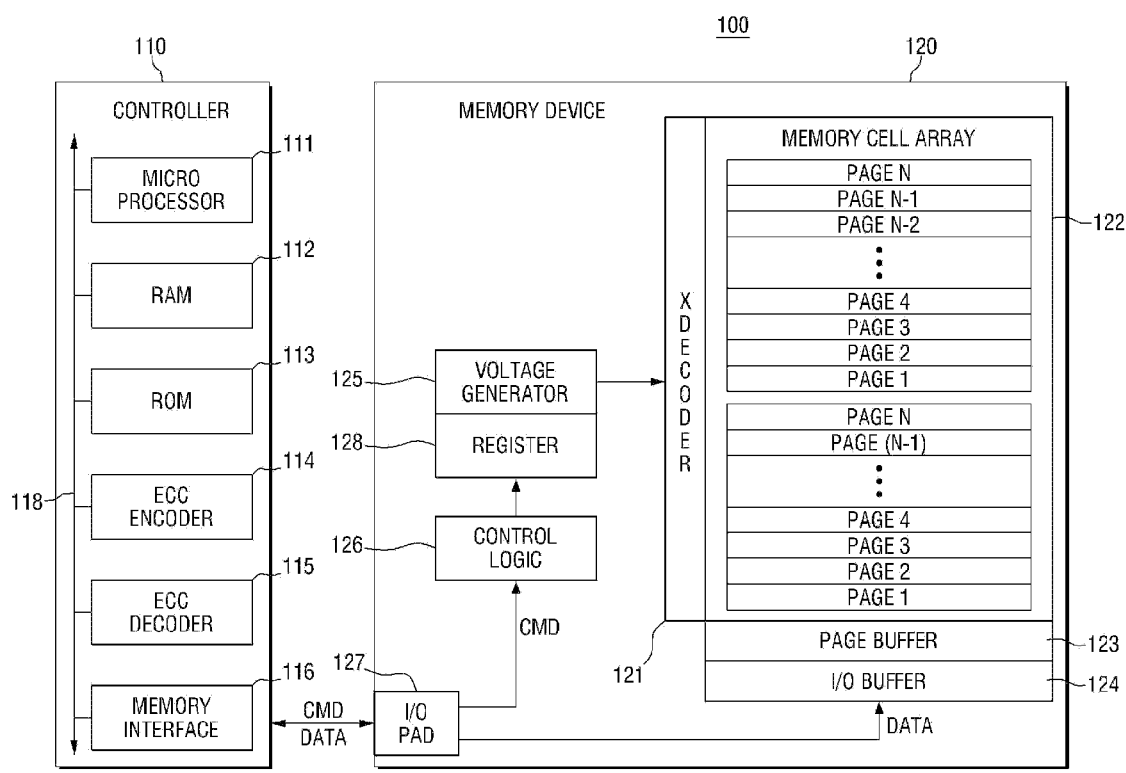
FIG. 5 is a block diagram of a memory system comprising a memory controller according an embodiment of the inventive concept.

FIG. 5 is a block diagram of a memory system 100 comprising a memory controller 110 according to an embodiment of the inventive concept. Memory controller 110 may be used to control methods such as those described above in relation to FIGS. 1 through 4.

Referring to FIG. 5, memory system 100 comprises memory controller 110 and a nonvolatile memory device 120. Nonvolatile memory device 120 may be, but is not limited to, a NAND flash memory device, or a plurality of NAND flash memory devices. Nonvolatile memory device 120 may have a planar structure or a three-dimensional (3D) memory cell structure with a stack of memory cells.

Nonvolatile memory device 120 typically comprises a memory cell array 122, an X decoder 121, a voltage generator 125, an input/output (I/O) pad 127, an I/O buffer 124, a page buffer 123, and a control logic 126.

Memory cell array 122 comprises a plurality of word lines W/L and a plurality of bit lines B/L. Each memory cell may be implemented as a memory cell having a floating gate or a charge storage layer such as a charge trapping layer.

Memory cell array 122 comprises a plurality of blocks and a plurality of pages. One block comprises a plurality of pages. A page may be a unit of program and read operations, and a block may be a unit of erase operation.

Control logic 126 controls overall operations of nonvolatile memory device 120. When receiving a command CMD from memory controller 110, control logic 126 interprets command CMD and controls nonvolatile memory device 120 to perform an operation (e.g., a program operation, a read operation, a read retry operation, or an erase operation) according to the interpreted command CMD.

X decoder 121 is controlled by control logic 126 and drives at least one of word lines W/L in memory cell array 122 according to a row address.

Voltage generator 125 is controlled by control logic 126 to generate one or more voltages required for a program operation, a read operation or an erase operation and provide the generated voltages to one or more rows selected by X decoder 121.

A register 128 is a space in which information input from memory controller 110 is stored and may comprise a plurality of latches. For example, register 128 may group read voltage information and store the information in the form of a table.

Page buffer 123 is controlled by control logic 126 and operates as a sense amplifier or a program driver according to an operation mode (e.g., a read operation or a program operation).

I/O pad 127 and the I/O buffer 124 serve as I/O paths of data exchanged between an external device, e.g., memory controller 100 or a host and nonvolatile memory device 120.

Memory controller 110 comprises a microprocessor 111, a read-only memory (ROM) 113, a random access memory (RAM) 112, an ECC decoder 115, an ECC encoder 114, a memory interface 116, and a bus 118. Elements 111 through 116 of memory controller 110 are electrically connected to each other through bus 118.

Microprocessor 111 controls overall operations of memory system 100 comprising memory controller 110. Where power is supplied to memory system 100, microprocessor 111 drives firmware (stored in ROM 113) for operating memory system 100 on RAM 112, thereby controlling the overall operation of memory system 100.

While driving firmware code of memory system 100 is stored in ROM 113, the scope of the inventive concept is not limited to this configuration. For example, the firmware code could alternatively be stored in nonvolatile memory device 120. Accordingly, the control or intervention of microprocessor 111 may encompass not only direct control of microprocessor 111 but also intervention of firmware comprising software driven by microprocessor 111.

RAM 112 acts as a buffer and stores an initial command, data, and various variables input from the host or data output from nonvolatile memory device 120. In addition, RAM 112 may store data and various parameters and variables input to and output from nonvolatile memory device 120.

Memory interface 116 serves as an interface between memory controller 110 and nonvolatile memory device 120. Memory interface 116 is connected to I/O pad 127 of nonvolatile memory device 120 and exchanges data with I/O pad 127. In addition, memory interface 116 may create a command suitable for nonvolatile memory device 120 and provide the created command to I/O pad 127 of nonvolatile memory device 120. Memory interface 116 provides a command to be executed by nonvolatile memory device 120 and an address ADD of nonvolatile memory device 120.

ECC decoder 115 and ECC encoder 114 perform error bit correction. ECC encoder 114 generates data added with a parity bit by performing error correction encoding on data provided to nonvolatile memory device 120. The parity bit may be stored in nonvolatile memory device 120.

ECC decoder 115 performs error correction decoding on output data, determines whether the error correction decoding is successful based on the result of the error correction decoding, and outputs an instruction signal based on the determination result. Read data may be transmitted to ECC decoder 115, and ECC decoder 115 may correct an error bit of the data using the parity bit. Where the number of error bits exceeds a limit of error bits that can be corrected, ECC decoder 115 cannot correct an error bit, resulting in error correction failure. ECC encoder 114 and ECC decoder 115 may perform error correction using, for example, low density parity check (LDPC) code, BCH code, turbo code, Reed-Solomon code, convolution code, recursive systematic code (RSC), or coded modulation such as trellis-coded modulation (TCM) or block coded modulation (BCM). Each of ECC encoder 114 and ECC decoder 115 may comprise an error correction circuit, system or device.

Memory controller 110 typically performs program and blanking operations using a method such as those described above with reference to FIGS. 1 through 4. For example, memory controller 110 may program a data signal to a first memory cell of nonvolatile memory device 110, attempt to program a additional data signal to the first memory cell in a state where the first memory cell is not erased, and mark the first memory cell as blank when failing to program the additional data signal to the first memory cell. Where the additional data signal is smaller than the data signal, memory controller 110 may fail to program the additional data signal to the first memory cell. Marking the first memory cell as blank is to program a preset blanking signal to the first memory cell. The preset blanking signal may be a signal corresponding to a uppermost threshold voltage distribution.

Alternatively, memory controller 110 may provide addresses of some memory cells (that is, unused memory cells) to which the additional data signal fails to be programmed. The positions of the unused memory cells may be indicated by short addresses in a memory sub-block that comprises the unused memory cells. In addition to providing the addresses of the unused memory cells, the number of unused memory cells in each memory sub-block may be included in a header and provided accordingly.

Figure 6:
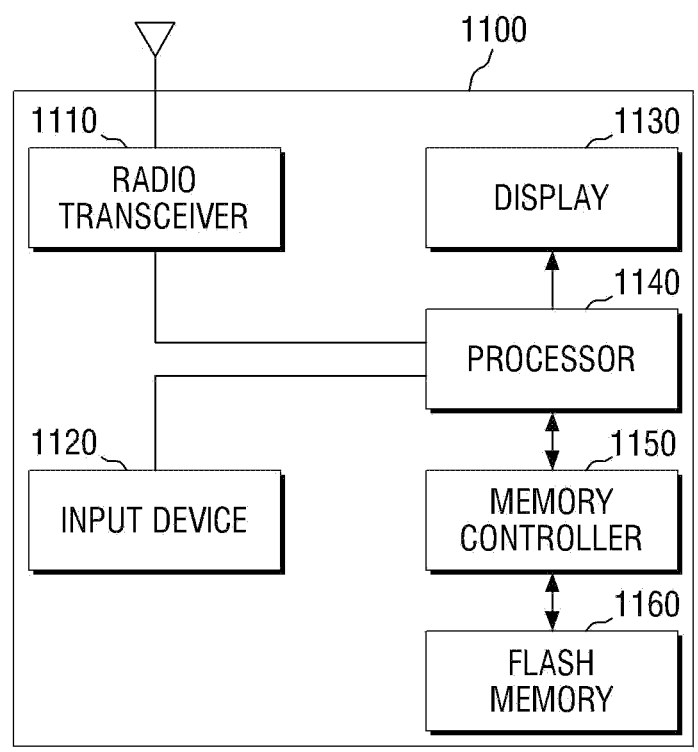
FIGS. 6 through 11 are block diagrams of electronic devices comprising a memory controller according to various embodiments of the inventive concept.

FIG. 6 is a block diagram of an electronic device 1100 comprising a memory controller 1150 according to an embodiment of the inventive concept.

Referring to FIG. 6, electronic device 1100 may be a cellular phone, a smart phone, or a table personal computer (PC), for example. Electronic device 1100 comprises a nonvolatile memory device 1160, which can be implemented as a flash memory device, for example, and memory controller 1150 controlling the operation of nonvolatile memory device 1160.

Memory controller 1150 can be implemented the same as memory controller 110 shown in FIG. 5, for instance. Memory controller 1150 is controlled by a processor 1140, which controls the overall operation of electronic device 1100. Memory controller 1150 controls data stored in nonvolatile memory device 1160 to be displayed on a display 1130.

A radio transceiver 1110 receives and transmits radio signals through an antenna ANT. For example, radio transceiver 1110 may convert a radio signal received through antenna ANT into a signal that can be processed by processor 1140. Therefore, processor 1140 may process the signal output from radio transceiver 1110 and store the processed signal in nonvolatile memory device 1160 via memory controller 1150 or display the processed signal on display 1130. Radio transceiver 1110 converts a signal output from processor 1140 into a radio signal and transmit the radio signal through antenna ANT.

An input device 1120 is a device by which a control signal for controlling the operation of processor 1140 or data to be processed by processor 1140 can be input. Input device 1120 can be implemented as a pointing device such as a touchpad or computer mouse, a keypad, or a keyboard.

Processor 1140 controls display 1130 to display data output from nonvolatile memory device 1160, a radio signal output from radio transceiver 1110, or data output from input device 1120.

Figure 7:
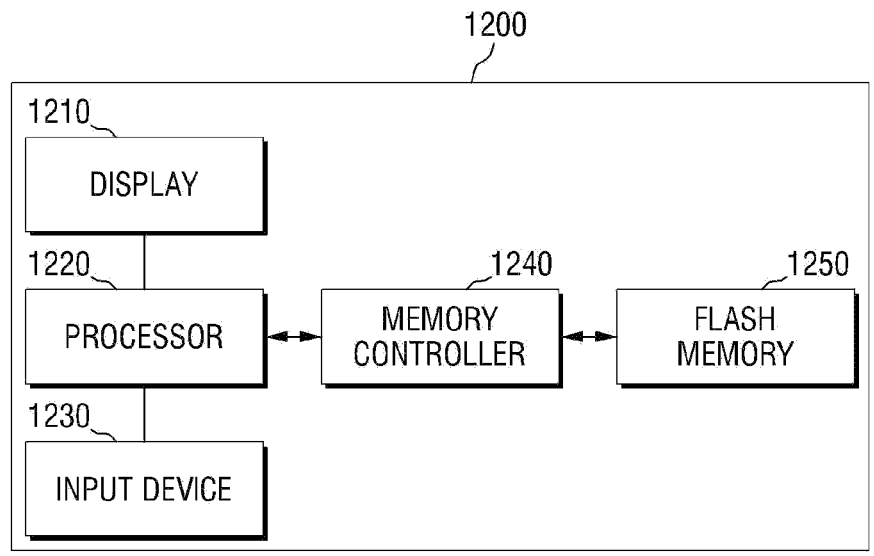

FIG. 7 is a block diagram of an electronic device 1200 comprising a memory controller 1240 according to another embodiment of the inventive concept.

Referring to FIG. 7, electronic device 1200 may be a data processor such as a PC, a table computer, a net-book, an e-reader, a personal digital assistant (PDA), a portable multimedia player (PMP), an MP3 player, or an MP4 player, for example. Electronic device 1200 comprises a nonvolatile memory device 1250 such as a flash memory device and memory controller 1240 which can control the operation of nonvolatile memory device 1250.

Memory controller 1240 may be memory controller 110 shown in FIG. 5. Electronic device 1200 may comprise a processor 1220 for controlling the overall operation of electronic device 1200. Memory controller 1240 is controlled by processor 1220.

In response to an input signal generated by an input device 1230, processor 1220 displays data stored in nonvolatile memory device 1250 on a display 1210. Input device 1230 may be, for example, a pointing device such as a touchpad or a computer mouse, a keypad, or a keyboard.

Figure 8:
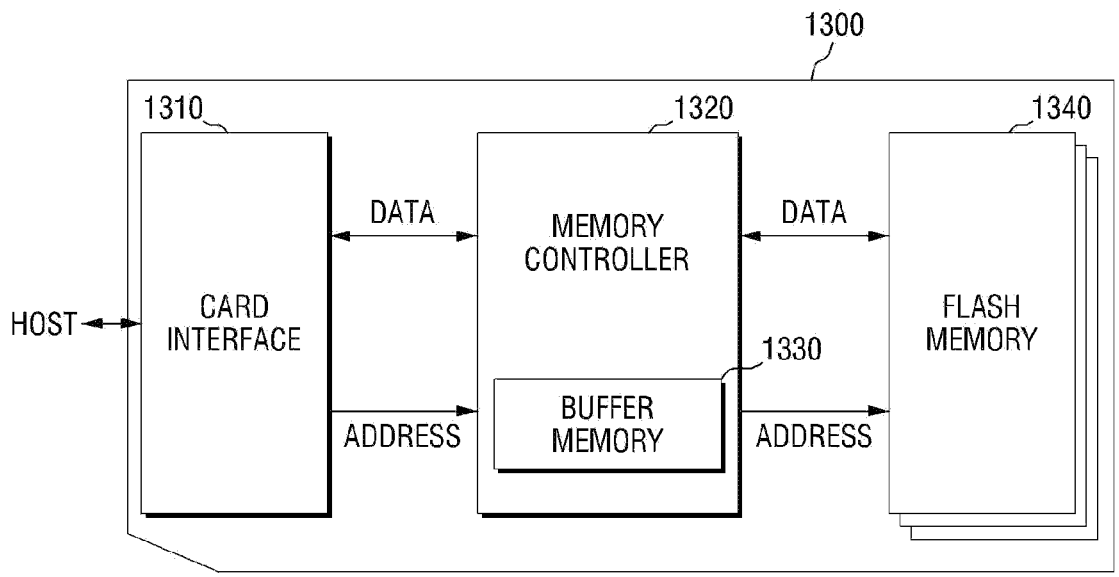

FIG. 8 is a block diagram of an electronic device 1300 comprising a memory controller 1320 according to another embodiment of the inventive concept.

Referring to FIG. 8, electronic device 1300 comprises a card interface 1310, memory controller 1320, and a nonvolatile memory device 1340 (e.g., a flash memory device).

Electronic device 1300 exchanges data with a host HOST through card interface 1310. In various alternative embodiments, card interface 1310 may be, for example, a secure digital (SD) card interface or a multimedia card (MMC) interface. Card interface 1310 may interface data exchange between host HOST and memory controller 1320 according to a communication protocol of host HOST which can communicate with electronic device 1300.

Memory controller 1320 controls the overall operation of electronic device 1300 and controls data exchange between card interface 1310 and nonvolatile memory device 1340. In addition, a buffer memory 1330 of memory controller 1320 may buffer data exchanged between card interface 1310 and nonvolatile memory device 1340.

Memory controller 1320 is connected to card interface 1310 and nonvolatile memory device 1340 through a data bus DATA and an address bus ADDRESS. In various alternative embodiments, memory controller 1320 may receive an address of data to be read or programmed from card interface 1310 through address bus ADDRESS and transmit the received address to nonvolatile memory device 1340.

Memory controller 1320 receives or transmits data to be read or programmed through data bus DATA which is connected to each of card interface 1310 and nonvolatile memory device 1340. Memory controller 1320 may be memory controller 110 shown in FIG. 5.

Where electronic device 1300 of FIG. 8 is connected to host HOST such as a PC, a table PC, a digital camera, a digital audio player, a mobile phone, console video game hardware or a digital settop box, host HOST may receive data stored in nonvolatile memory device 1340 or transmit data to be stored in nonvolatile memory device 1340 through card interface 1310 and memory controller 1320.

Figure 9:
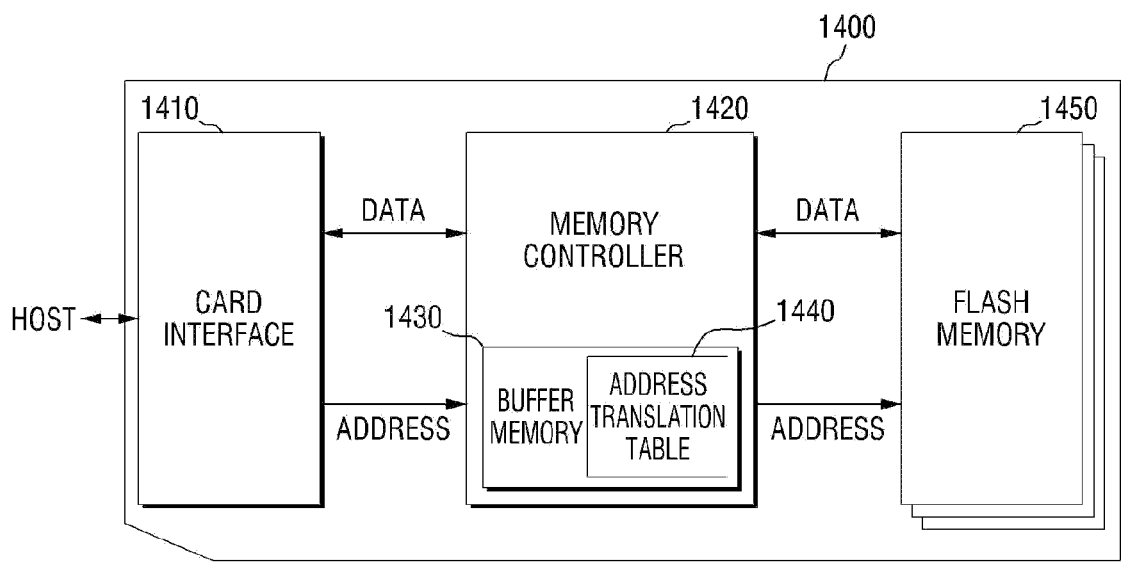

FIG. 9 is a block diagram of an electronic device 1400 comprising a memory controller 1420 according to another embodiment of the inventive concept.

Referring to FIG. 9, electronic device 1400 comprises a card interface 1410, memory controller 1420, and a nonvolatile memory device 1450 (e.g., a flash memory device).

Electronic device 1400 performs data communication with a host HOST through card interface 1410. In various alternative embodiments, card interface 1410 may be, for example, an SD card interface, or an MMC interface. Card interface 1410 performs data communication between host HOST and memory controller 1420 according to a communication protocol of host HOST which can communicate with electronic device 1400.

Memory controller 1420 controls overall operation of electronic device 1400 and controls data exchange between card interface 1410 and nonvolatile memory device 1450.

A buffer memory 1430 in memory controller 1420 stores various data for controlling the overall operation of electronic device 1400. Memory controller 1420 is connected to card interface 1410 and nonvolatile memory device 1450 through a data bus DATA and a logical address bus LOGICAL ADDRESS.

Memory controller 1420 typically receives an address of read data or program data from card interface 1410 through logical address bus LOGICAL ADDRESS and transmits the received address to nonvolatile memory device 1450 through a physical address bus PHYSICAL ADDRESS. In addition, memory controller 1420 may receive or transmit read data or program data through a data bus DATA connected to each of card interface 1410 and nonvolatile memory device 1450. Memory controller 1420 may be memory controller 110 shown in FIG. 5.

Memory controller 1420 of electronic device 1400 comprises an address translation table 1440 in buffer memory 1430. Address translation table 1440 typically comprises a logical address input from an external source and a logical address for accessing nonvolatile memory device 1450. During a program operation, memory controller 1420 programs new data to a physical address and updates address translation table 1440.

Memory controller 1420 selects from address translation table 1440 a physical address at which both a read operation and a program operation can be performed by referring to a physical address of data being programmed.

Memory controller 1420 performs both program and read operations and updates address translation table 1440 according to these operations, which can improve the operating time of electronic device 1400.

Where electronic device 1400 of FIG. 9 is connected to host HOST such as a PC, a table PC, a digital camera, a digital audio player, a mobile phone, console video game hardware or a digital settop box, host HOST may receive data stored in nonvolatile memory device 1450 or transmit data to be stored in nonvolatile memory device 1450 through card interface 1410 and memory controller 1420.

Figure 10:
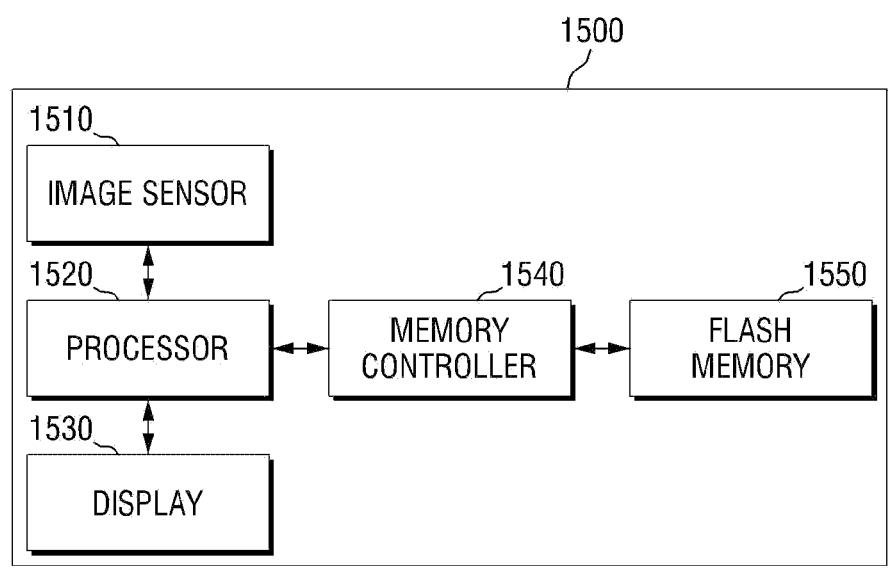

FIG. 10 is a block diagram of an electronic device 1500 comprising a memory controller 1540 according to another embodiment of the inventive concept.

Referring to FIG. 10, electronic device 1500 comprises a nonvolatile memory device 1550 such as a flash memory device, memory controller 1540 which controls the data processing operation of nonvolatile memory device 1550, and a processor 1520 which controls the overall operation of electronic device 1500. Memory controller 1540 may be implemented by memory controller 110 of FIG. 5, for example.

An image sensor 1510 of electronic device 1500 converts an optical signal into a digital signal, and the digital signal is stored in nonvolatile memory device 1550 or displayed on a display 1530 under the control of processor 1520. The digital signal stored in nonvolatile memory device 1550 is displayed on display 1530 under the control of processor 1520.

Figure 11:
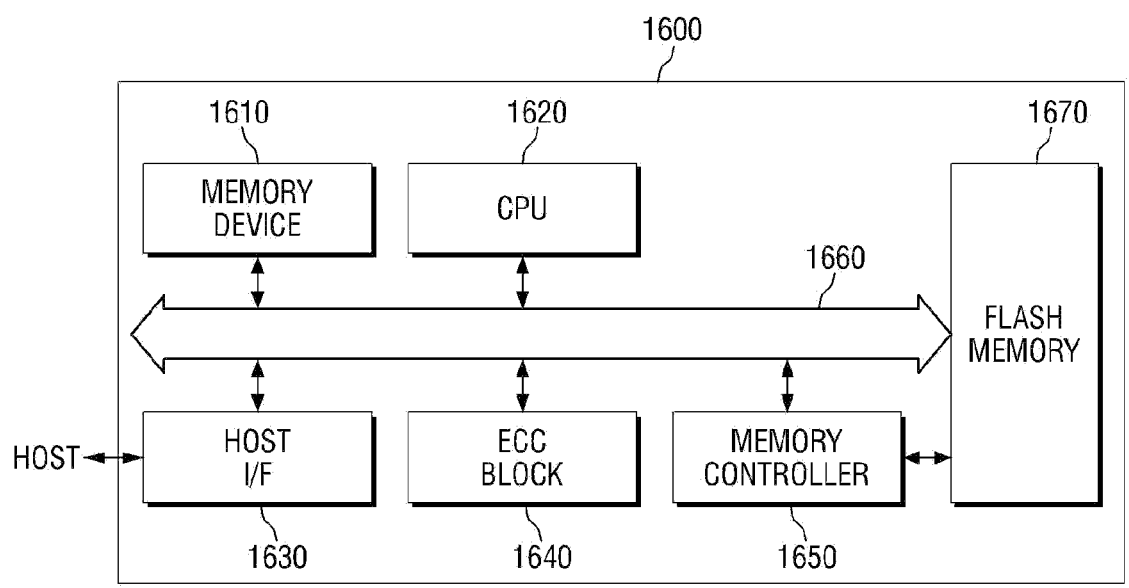

FIG. 11 is a block diagram of an electronic device 1600 comprising a memory controller 1650 according to an embodiment of the inventive concept.

Referring to FIG. 11, electronic device 1600 comprises a nonvolatile memory device 1670 such as a flash memory device, memory controller 1650 controlling the operation of nonvolatile memory device 1670, and a central processing unit (CPU) 1620 controlling operations of electronic device 1600.

Electronic device 1600 comprises a memory device 1610 that can be used as an operation memory of CPU 1620. Memory device 1610 may be implemented as a nonvolatile memory such as a ROM or a volatile memory such as a dynamic RAM (DRAM).

A host HOST connected to electronic device 1600 may exchange data with nonvolatile memory device 1670 through memory controller 1650 and a host interface 1630. Here, memory controller 1650 may function as a memory interface, for example, a flash memory interface. Memory controller 1650 may be memory controller 110 shown in FIG. 5.

In some embodiments, electronic device 1600 further comprises an ECC block 1640. ECC block 1640 controlled by CPU 1620 may detect and correct an error in data read from nonvolatile memory device 1670 through memory controller 1650.

CPU 1620 may control data exchange between memory controller 1650, ECC block 1640, host interface 1630, and memory device 1610 through a bus 1660. electronic device 1600 may be implemented as a universal serial bus (USB) memory drive or a memory stick.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory device, comprising:
    performing a first program operation to program a first data signal in a first memory cell, wherein the first data signal is programmed as a first program state having a first threshold voltage range;
    determining whether a second data signal corresponds to a program state having a threshold voltage range lower than the first threshold voltage range; and
    upon determining that the second data signal corresponds to a program state having a threshold voltage range lower than the first threshold voltage range, performing a second program operation to program a blanking signal in the first memory cell, wherein the blanking signal is programmed as a blank state having a second threshold voltage range greater than the first threshold voltage range.

2. The method of claim 1, further comprising upon determining that the second data signal does not correspond to a program state having a threshold voltage range lower than the first threshold voltage range, performing a third program operation to program the second data signal in the first memory cell, wherein the second data signal is programmed as a second program state having a third threshold voltage range greater than the first threshold voltage range and less than the second threshold voltage range.

3. The method of claim 1, wherein the second threshold voltage range corresponds to an uppermost threshold voltage distribution for the first memory cell.

4. The method of claim 1, wherein the first memory cell is configured to store K bits of data using $2^K+1$ threshold voltage distributions, wherein one of the threshold voltage distributions corresponds to the blank state.

5. The method of claim 1, further comprising reading the first memory cell, and upon detecting the blank state, ignoring data stored in the first memory cell.

6. The method of claim 1, further comprising programming the second data signal to a second memory cell as a consequence of determining that the second data signal does not correspond to the program state having the threshold voltage range lower than the first threshold voltage range.

7. The method of claim 1, wherein the first and second program operations are performed on the first memory cell without an intervening erase operation of the first memory cell.

8. A method of reprogramming a NAND flash memory device prior to erase, the method comprising:
    programming a data signal to a plurality of memory cells of a memory device;
    attempting to program an additional data signal to the memory cells in a state where the memory cells are not programmed; and
    generating supplemental data identifying addresses of some memory cells among the memory cells to which the additional data signal fails to be programmed,
    wherein the attempting to program the additional data signal to the memory cells comprises comparing the additional data signal with the data signal, wherein the additional data signal fails to be programmed to the memory cells when the additional data signal is smaller than the data signal, and wherein when the additional data signal is greater than the data signal, the additional data signal is programmed to the memory cells by additionally programming a difference between the data signal and the additional data signal to the memory cells.

9. The method of claim 8, wherein the memory cells are divided into two or more memory sub-blocks, and positions of the memory cells to which the additional data signal fails to be programmed are indicated by short addresses in a memory sub-block comprising the memory cells.

* * * * *